(12) United States Patent  (10) Patent No.: US 9,059,555 B2
Connolly et al.  (45) Date of Patent: Jun. 16, 2015

(54) WAVELENGTH-STABILIZED DIODE LASER

(71) Applicants: John C. Connolly, Clarksburg, NJ (US); Donald E Ackley, Cardiff, CA (US); Scott L. Rudder, Hopewell, NJ (US); Harald R. Guenther, Schnecksville, PA (US)

(72) Inventors: John C. Connolly, Clarksburg, NJ (US); Donald E Ackley, Cardiff, CA (US); Scott L. Rudder, Hopewell, NJ (US); Harald R. Guenther, Schnecksville, PA (US)

(73) Assignee: Innovative Photonic Solutions, Monmouth Junction, NJ (US)

( * ) Notice: Subject to any disclaimer, the term of this patent is extended or adjusted under 35 U.S.C. 154(b) by 0 days.

(21) Appl. No.: 13/957,586

(22) Filed: Aug. 2, 2013

(65) Prior Publication Data

US 2014/0072004 A1  Mar. 13, 2014

Related U.S. Application Data

(60) Provisional application No. 61/700,224, filed on Sep. 12, 2012.

(51) Int. Cl.
*H01S 3/04* (2006.01)
*H01S 5/14* (2006.01)
*H01S 5/022* (2006.01)
*H01S 5/024* (2006.01)
*H01S 5/06* (2006.01)
*H01S 5/068* (2006.01)

(52) U.S. Cl.
CPC .............. *H01S 3/0405* (2013.01); *H01S 5/141* (2013.01); *H01S 5/02212* (2013.01); *H01S 5/02248* (2013.01); *H01S 5/02296* (2013.01); *H01S 5/02415* (2013.01); *H01S 5/02438* (2013.01); *H01S 5/02469* (2013.01); *H01S 5/0617* (2013.01); *H01S 5/06804* (2013.01)

(58) Field of Classification Search
CPC . H01S 3/10069; H01S 5/024; H01S 5/02415; H01S 5/02438; H01S 5/02446; H01S 5/0617; H01S 5/06808; H01S 3/042; H01S 3/025; H01S 5/041
USPC ....................................... 372/34, 54
See application file for complete search history.

(56) References Cited

U.S. PATENT DOCUMENTS

| | | | | |
|---|---|---|---|---|
| 6,845,109 B2 * | 1/2005 | Lee et al. | .................. | 372/29.02 |
| 6,915,035 B2 * | 7/2005 | Iwafuji | .......................... | 385/24 |
| 6,996,142 B2 * | 2/2006 | Kai et al. | ......................... | 372/34 |
| 7,058,099 B2 * | 6/2006 | Stewart et al. | .................. | 372/32 |
| 7,822,086 B2 * | 10/2010 | Brown et al. | .............. | 372/38.02 |
| 2005/0063441 A1 * | 3/2005 | Brown | .......................... | 372/50 |
| 2010/0111122 A1 * | 5/2010 | Pushkarsky et al. | ............ | 372/32 |

* cited by examiner

Primary Examiner — Xinning Niu
Assistant Examiner — Vu A Vu
(74) Attorney, Agent, or Firm — Law Office of Carl Giordano, PC

(57) ABSTRACT

A hybrid external cavity laser (HECL) system comprises a diode laser, collection and collimation optics, and a volume Bragg grating, emits radiation at a single wavelength with a short-term wavelength stability in the order of at least one part in a billion The wavelength stability is achieved by use of a thermal management system, comprising inner and outer housings, each containing a temperature sensor, and electronic circuitry that monitors the temperatures and controls both the laser diode current and a thermoelectric cooler based on temperatures determined from said temperature sensors. The laser system is packaged in a compact enclosure that minimizes waste heat, facilitating use in applications that have heretofore employed stable, single-frequency lasers, including He—Ne lasers.

17 Claims, 10 Drawing Sheets

WAVELENGTH-STABILIZED DIODE LASER

CLAIM OF PRIORITY

This application claims, pursuant to 35 USC 119, priority to and the benefit of, the earlier filing date to that U.S. Provisional Application Ser. No. 61/700,224, entitled, "Wavelength Stabilized Diode Laser as Replacement for Helium Neon (HE—NE) Laser," filed Sep. 12, 2012. The entire content of the above-referred-to application is incorporated by reference, herein.

FIELD OF THE INVENTION

The present invention relates to the field of semiconductor lasers and more particularly to a wavelength stabilized semiconductor diode laser.

BACKGROUND

Many optical metrology instruments require wavelength-stabilized, single-mode laser sources to operate correctly. Examples are Fourier transform (FT) spectrometers, particle counters and industrial measurement equipment for alignment, positioning, monitoring, or scanning. Many of these instruments have used helium-neon (He—Ne) lasers because of their excellent beam quality and high degree of wavelength stability. Since He—Ne lasers became widely available in the mid-1960s, they have been the only viable choice of laser sources for several decades. This began to change with the advent of the semiconductor diode laser. Starting in the early 1990s, semiconductor diodes began to replace He—Ne lasers in many metrology applications.

By comparison to He—Ne gas lasers, diode lasers are more compact and robust, less expensive, electrically more efficient, radiate less waste heat, and easier to use as they don't require long warm-up times or kilovolts to operate. Overall, laser diodes offer a lower cost alternative for many applications. Until recently, however, they could not be used in products that required extremely high spectral stability and ultra-low wavelength drift due to strong temperature-dependence of the semiconductor material from which they are made. Single-mode diode lasers, such as distributed feedback (DFB) lasers, exhibit a temperature dependence of their optical emission wavelength of about 0.07 nm/° C. (nanometers per degree C.). This temperature dependence alone makes the use of laser diodes difficult and costly in applications requiring a high degree of wavelength stability.

Hence, there is a need in the industry for a method and system for providing temperature compensation to laser diodes in order to achieve a high degree of wavelength stability

SUMMARY OF THE INVENTION

The system and method described herein relate to a wavelength-stabilized diode laser in a compact hybrid external cavity configuration that includes a volume Bragg grating element. The thermal management and electronic systems and methods disclosed provide a significant improvement in wavelength stability.

The short-term wavelength stability of the hybrid external cavity laser disclosed herein is better than that produced by conventional volume Bragg grating stabilized semiconductor laser systems.

The systems and methods disclosed herein is applicable to emission at any wavelength at which semiconductor lasers can oscillate; currently including wavelengths as short as 375 nm in the ultraviolet range to approximately 3 μm in the infrared range.

Exemplary embodiments described herein provide devices, systems and methods that enable laser emission with significantly reduced wavelength drift. The laser system comprises a diode laser that oscillates at a single wavelength by seeding an amplifying medium by reflection from a volume Bragg grating configured as a hybrid external cavity laser (HECL). An advanced thermal management system and electronic drive circuit reduces wavelength drift inherent in described prior art systems and operates of a wide range of temperature changes in the environment. These features are packaged into a compact enclosure while minimizing waste heat, which may be transferred to other parts of a larger system; facilitating use in applications that have heretofore employed stable, single-frequency lasers including He—Ne lasers.

With respect to He—Ne lasers, in particular, the benefits of a diode laser-based hybrid external cavity laser include: mechanical robustness (i.e., no fragile glass gas-discharge tube), an order-of-magnitude lower electrical power consumption and fast wavelength-stabilization times;

A key consideration in realization of the wavelength-stabilized lasers described herein is minimization of the effects of changes in the ambient temperature in which the laser operates. Such temperature creates thermal gradients and sets up thermal convection inside the outer housing of the laser that, in turn, causes variations in the laser diode temperature and commensurate changes in wavelength and output power.

The exemplary compact lasers described herein maintain a long-term wavelength stability in the range of one part in a million (1 part in $10^6$), which is maintained over a range of ambient operating temperatures that may span 20° C. (degrees centigrade) or more. Short-term wavelength stability may be of the order of one part in a billion (1 part in $10^9$).

The hybrid external cavity laser is contained in a small, thermally insulated volume from which excess heat is removed by a thermoelectric cooler (TEC) into a larger outer housing that assists in isolating the inner container from thermal fluctuation in the ambient environment in which the laser is used. The temperature of the HECL itself is monitored by a temperature sensor located proximate to the laser chip. A second temperature sensor is on a printed circuit board comprising laser and TEC control electronics to monitor the temperature of the ambient temperature within the outer housing. Data from the second temperature sensor is also used to control the temperature of the HECL.

BRIEF DESCRIPTION OF THE DRAWINGS

For a better understanding of exemplary embodiments and to show how the same may be carried into effect, reference is made to the accompanying drawings. It is stressed that the particulars shown are by way of example only and for purposes of illustrative discussion of the preferred embodiments of the present disclosure, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

It is to be understood that the figures and descriptions of the present invention described herein have been simplified to illustrate the elements that are relevant for a clear understanding of the present invention, while eliminating, for purposes of clarity only, many other elements. However, because these eliminated elements are well-known in the art, and because they do not facilitate a better understanding of the present invention, a discussion of such elements or the depiction of such elements is not provided herein. The disclosure herein is directed also to variations and modifications known to those skilled in the art.

DETAILED DESCRIPTION

Before the present devices, systems and methods are described, it is to be understood that this invention is not limited to the particular processes, devices, or methodologies described, as these may vary. It is also to be understood that the terminology used in the description is for the purpose of describing the particular versions or embodiments only and is not intended to limit the scope of the present disclosure which will be limited only by the appended claims.

Certain terms are defined in this section to facilitate understanding of exemplary embodiments.

The term "volume Bragg grating," as used herein, refers to an optical element that diffracts incident light by periodic Bragg gratings formed within a medium that allows transmission of a portion of the incident light and is synonymous with the term "volume holographic grating". Such gratings are often formed by use of holographic techniques, wherein intersecting beams originating from a single laser interfere in the optical medium, causing a long-lasting physical perturbation of that medium.

The term "Bragg grating," as used herein, refers to a transparent device having a periodic variation of its refractive index, so that a large portion of the light is diffracted at 180° to the angle of incidence (i.e., the light is reflected) in a bandwidth around an optical wavelength that satisfies the Bragg condition:

$$\frac{2\pi}{\Lambda} = 2\frac{2\pi n}{\lambda}\cos\theta,$$

where $\lambda$ is the vacuum wavelength of the light, n is the refractive index of the medium, the propagation angle in the medium with respect to the direction normal of the grating, and $\Lambda$ is the grating period in the medium.

The term "hybrid external cavity laser," as used herein, refers to semiconductor laser in an optical cavity that includes collection and collimation optics and a volume holographic grating that reflects a portion of the light back to the semiconductor laser to seed the oscillating wavelength.

The term "HECL", as used herein, refers to a hybrid external cavity laser.

The term "TEC", as used herein, refers to a thermoelectric cooler.

The terms "diode laser" and "diode laser", as used interchangeably herein, and refer to a semiconductor device that provides optical amplification, whether or not such device would function as a stand-alone laser or not.

Figure 1:
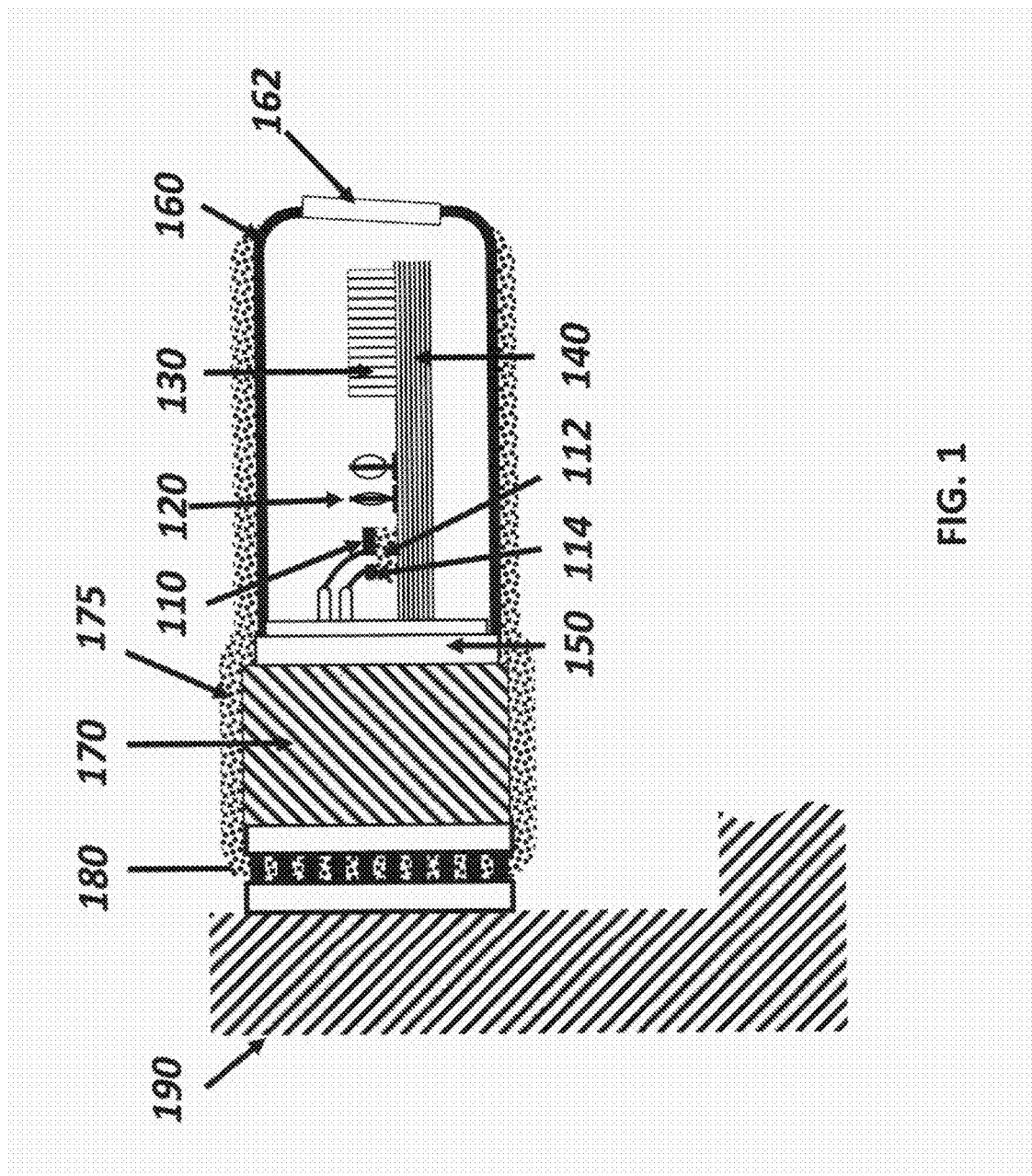
FIG. 1 is a schematic diagram of an exemplary hybrid external cavity laser in a TO-56 package, in accordance with the principles of the invention.

FIG. 1 is a schematic diagram illustrating an exemplary embodiment of the hybrid cavity external laser and related components in accordance with the principles of the invention. A semiconductor diode laser chip, 110, is mounted on a submount, 112, such that the output light of the laser chip is collected and collimated by optics, 120, to form collimated beam that is transmitted to and partially reflected from a volume Bragg grating, 130. The volume Bragg grating is an optical element in which an optical grating has been formed, often by interfering two beams of laser light intersecting at an angle, to define a grating period. A temperature sensor, 114, is positioned near the laser chip on the submount, 112, to provide temperature data that is used to control the operation of a thermoelectric cooler (TEC) or Peltier device, 180, used to stabilize the temperature of the HECL. In the embodiment shown, the laser chip submount, 112, optics, 120, and volume Bragg grating 130, are mounted in a TO-56 package that includes a flange, 150, through which electrical connector pins extend to allow electrical connection to the laser chip, 110, and temperature sensor, 114, a heatsink finger that also serves as an optical bench, 140, and a cap, 160, that includes an optical window, 162, through which the emitted laser beam can pass. The optical window, 162, may be tilted at a small angle and/or anti-reflection coated to eliminate feedback from the window into the HECL. A heatsink flange, 150, is in thermal contact with a thermal mass, 170, to help to minimize temperature fluctuations. A layer of insulating material, 175, surrounds the TO-56 package and part of the thermal mass, 170, to insulate those components from thermal fluctuations in their environment.

The laser chip, 110, is typically comprised of layers of group III-V elements, the composition and structure of which determine the emitted lasing wavelength. The range of lasing wavelengths now possible is 375 nm to approximately 3 μm. The laser chip is typically 1.0 to 1.5 mm in length, 300 μm wide, and 100 to 150 μm thick.

Optics, 120, collects and collimates the output light of the diode laser, and may be comprised of a single, or multiple, components. Additionally, the optics can be designed to compensate for astigmatism in the output of the diode laser and shape the output beam. For example, the output beam may be shaped to have a cross-section that is approximately circular having a nearly Gaussian beam intensity profile. One or more of the optical elements may be anamorphic (e.g., a cylindrical lens) to correct the disparity between the far-field emission beam patterns perpendicular to and parallel to the active layer of the laser chip. One or more of the optical elements may be spherically symmetric. The optical components may be conventional refractive elements, graded-index (GRIN) elements, or holographic elements. The dimensions of these components are typically 1×1 mm to 1.5×1.5 mm in width and height.

The volume Bragg grating, 130, often formed in a photorefractive material is typically about 1 mm in width, 1.5 mm in height, and 3 mm in length. The heatsink finger, 150, may be comprised of a copper-tungsten (CuW) alloy or other similar material and also serves as an optical bench for components mounted on it. The insulating material, 175, may be comprised of any suitable material, including but not limited to heat shrink tubing.

The thermal mass, 170, as illustrated is made of aluminum, or other similar heat conductive element, and has dimensions 8×8×3 mm with 4 mm center hole, and is in thermal contact with the cold side of a thermoelectric cooler, 180. In the embodiment shown, the TEC has dimensions of approximately 8×8×2 mm and can pump up to 3 W of heat. The hot side of the TEC, 180, is in thermal contact with either a housing, 190, surrounding the aforementioned elements or a thermally conductive member connected to such a housing.

Use of a diode laser in a HECL configuration provides a substantial reduction in output wavelength variation with respect to temperature compared with other approaches based on inclusion of a Bragg grating in a semiconductor laser chip itself. Such devices, including distributed feedback laser (DFB) and distributed Bragg reflector (DBR) lasers, exhibit a temperature drift of approximately 0.070 nm/° C., while the drift rate of a HECL is approximately 0.007 nm/° C. The inherent wavelength stability of the HECL allows the realization of a diode laser-based product in a module that can be manufactured that provides wavelength stability comparable to prior art wavelength-stabilized lasers, such as the He—Ne laser.

Figure 2:
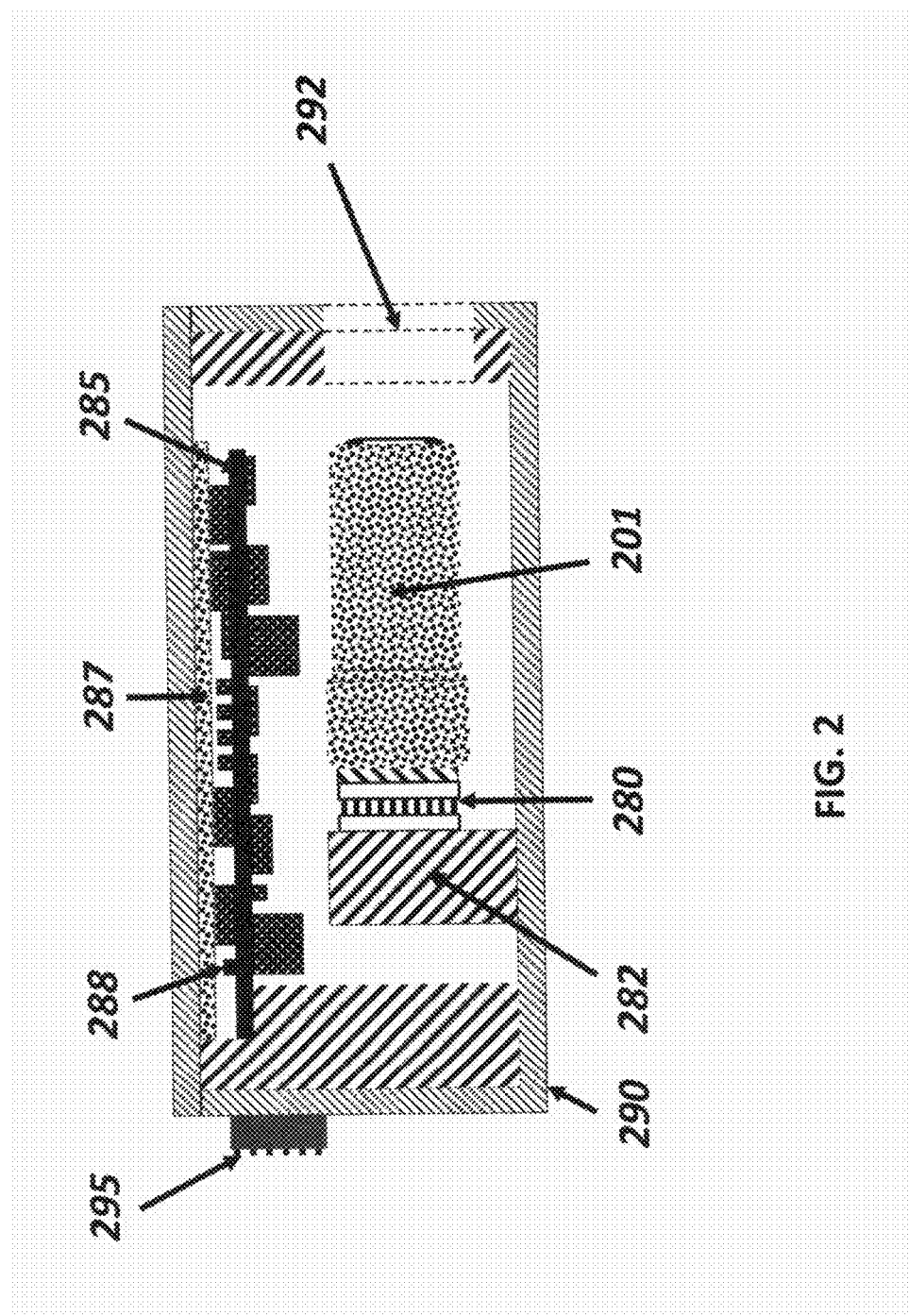
FIG. 2 is a schematic diagram of an exemplary compact, wavelength-stabilized laser module containing a hybrid external cavity laser in a TO-56 package, in accordance with the principles of the invention.

FIG. 2 is a schematic diagram showing a cross-section of the sub-system of FIG. 1, in an inner TO package, 201, enclosed in an outer housing, 290. The inner package, 201, comprises the component elements shown in FIG. 1, including: the diode laser chip, 110; the diode chip submount, 112; a first temperature sensor, 114, proximate to the diode laser chip; optics, 120; the volume Bragg grating, 130; the heatsink finger/optical bench, 140; the TO-56 flange, 150; the TO-56 cap, 160; the thermal mass, 170; and thermal insulation, 175. As shown in FIG. 2, the inner package, 201, is in mechanical and thermal contact with the cold side of a TEC, 280. The hot side of the TEC, 280, is in mechanical and thermal contact with a mounting member, 282, comprised of a material that has high thermal conductivity to provide a thermal path for heat to be transferred to the outer housing, 290. The outer housing, 290, incorporates an aperture, 292, which may be a hole or a window, through which the output beam of the HECL can be emitted. In an alternate embodiment, the output light may be coupled into an optical fiber (not shown).

The thermal drift rate of 0.007 nm/° C. of the HECL is due to the thermal drift rate of the volume Bragg grating, 130, itself. The temperature sensor, 124, is preferably positioned close to the laser chip, 110, in order to monitor the temperature of the laser chip, 110, as accurately as possible to maintain a desired input current and output optical power. While the center wavelength of the output spectrum of the laser chip, 110, does indeed shift—and at a rate of approximately 0.35 nm/° C., the output spectrum is smooth and such variations do not influence the output power of the HECL to a significant extent. The laser chip, 110, however, is a source of heat itself whereas the volume Bragg grating, 130, is not. Therefore, a thermal gradient arises, even when both components are mounted on the high-thermal conductivity heatsink finger/optical bench, 140. In practice, such a thermal gradient affects the temperature and, hence, reflection wavelength of the volume Bragg grating, 130.

Thermal stabilization of the environment of the inner package, 201, is achieved by enclosing it in a thermally-stabilized outer housing, 290. Methods of controlling the temperature of the volume Bragg grating, 130, are described below, with an exemplary embodiment described with respect to FIG. 5.

The outer housing, 290, contains electronics, depicted as being arranged on a double-sided printed circuit board, 285. A second temperature sensor, 288, is shown positioned on the printed circuit board, 285. In an alternate embodiment, the second temperature sensor, 288, may be within the outer housing, 290, itself. A compliant thermal interface material, 287, is positioned between the printed circuit board and the top of the outer housing, 290, to facilitate transfer of heat from the printed circuit board, 285, to the housing, 290.

The second temperature sensor, 288, monitors the temperature of the electronics board in order to allow compensation for variations of electronic component performance values with changing ambient temperatures. The second temperature sensor, 288, provides a signal, representing the temperature sensed, that is inputted into an algorithm that creates an offset of the diode laser temperature set-point. This ensures that the absolute temperature of the laser packages stays constant even when component values on the electronic board drift with environmental temperature changes. Either or both of the temperature sensors, 214 and 288, may be thermistors or other types of temperature sensors.

A user interface, 295, provides electrical contacts for an external DC power supply, an optional external photodetector monitor input, and other control and ground connections.

Figure 3:
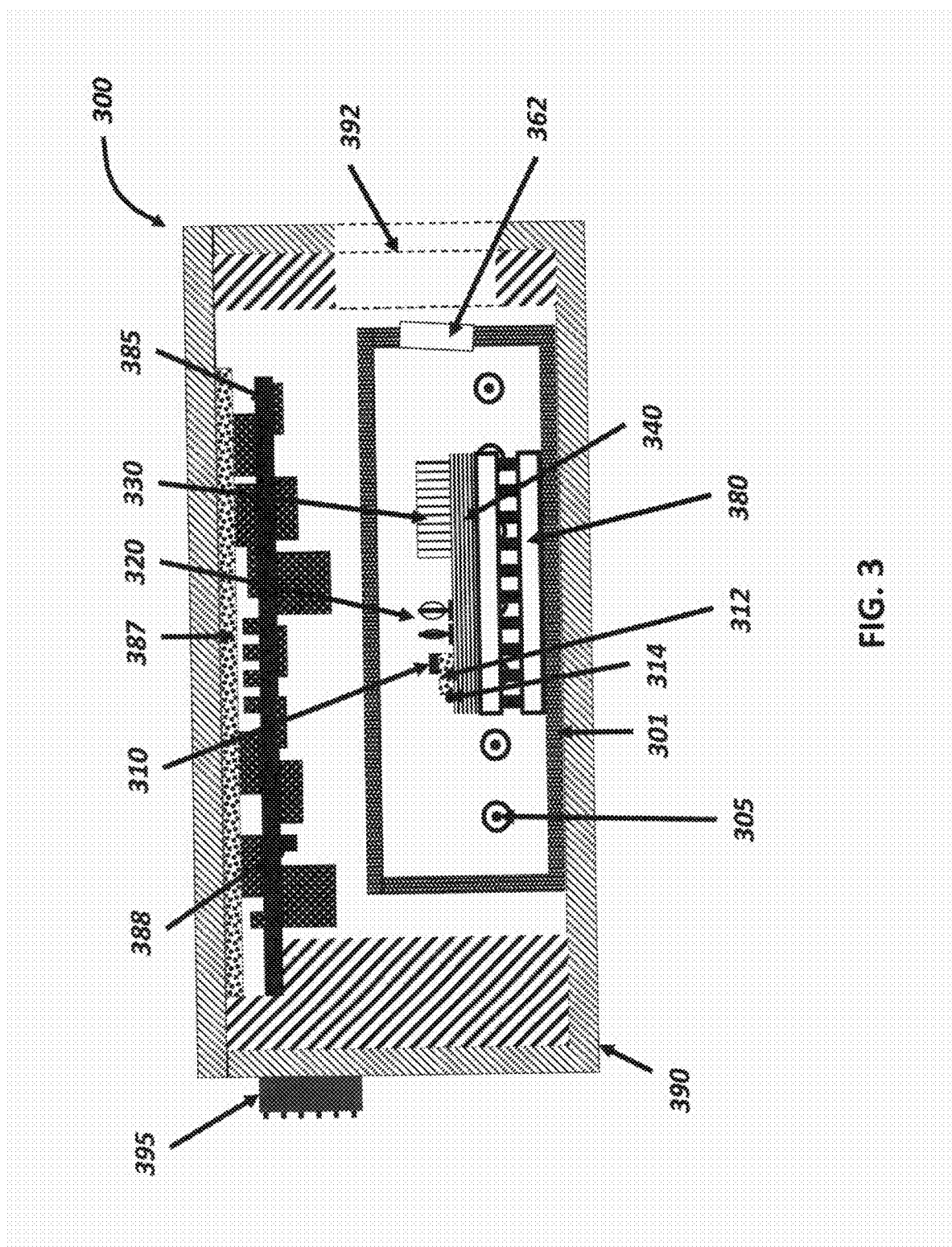
FIG. 3 is a schematic diagram of an exemplary compact, wavelength-stabilized laser module containing a hybrid external cavity laser in a 14-pin butterfly package, in accordance with the principles of the invention.

FIG. 3 is another exemplary embodiment of a diode laser-based module, 300, incorporating a HECL in a butterfly package, 301. The emission of the laser diode chip, 310, is collected and collimated by optical elements, 320. A volume Bragg grating, 330, provides selective feedback in a narrow wavelength band to the diode, forcing laser emission in a single-spatial, single-frequency mode having a line-width of 1 MHz or less. The diode laser chip may be mounted on a submount, 312.

A temperature sensor, 314, is located near the diode laser chip, 310, and may be positioned either on the submount, 312, or proximate to it on heatsink finger, 340, which also serves as an optical bench. An optical window, 362, on the butterfly package, 301, may be tilted and/or anti-reflection coated to eliminate unwanted reflections from window, 362, into the HECL. In this embodiment, the heatsink finger, 340, is mounted in thermal contact to the cold side of a thermoelectric cooler, 380. The hot side of the TEC, 380, is mounted in mechanical and thermal contact to the bottom of the butterfly package, 301, which is mounted in thermal contact to an outer housing, 390, comprised of a material that has high thermal conductivity, e.g., a high coefficient of heat transfer. An output aperture, 392, which may be a hole or a window, in the outer housing, 390, allows output of a collimated laser beam emitted by laser 310.

In an alternate embodiment, the output light may be coupled into an optical fiber (not shown).

In another alternate embodiment, the thermoelectric cooler, 380 may be located between the butterfly package, 301, and the outer housing, 390.

The outer housing, 390, contains electronics, depicted as being arranged on a double-sided printed circuit board, 385, in the embodiment of FIG. 3. A second temperature sensor, 388, is shown positioned on the bottom portion of the printed circuit board, 385. In alternate embodiments, the second temperature sensor, 388, may be positioned on the top of the printed circuit board or on or within the outer housing, 390, itself. A compliant thermal interface material, 387, is positioned between the printed circuit board and the top of the outer housing, 390, to facilitate transfer of heat from the printed circuit board, 385, to the housing, 390. User interface, 395, provides electrical contacts for an external DC power supply, an optional external photodetector monitor input, and other control and ground connections.

Figure 4:
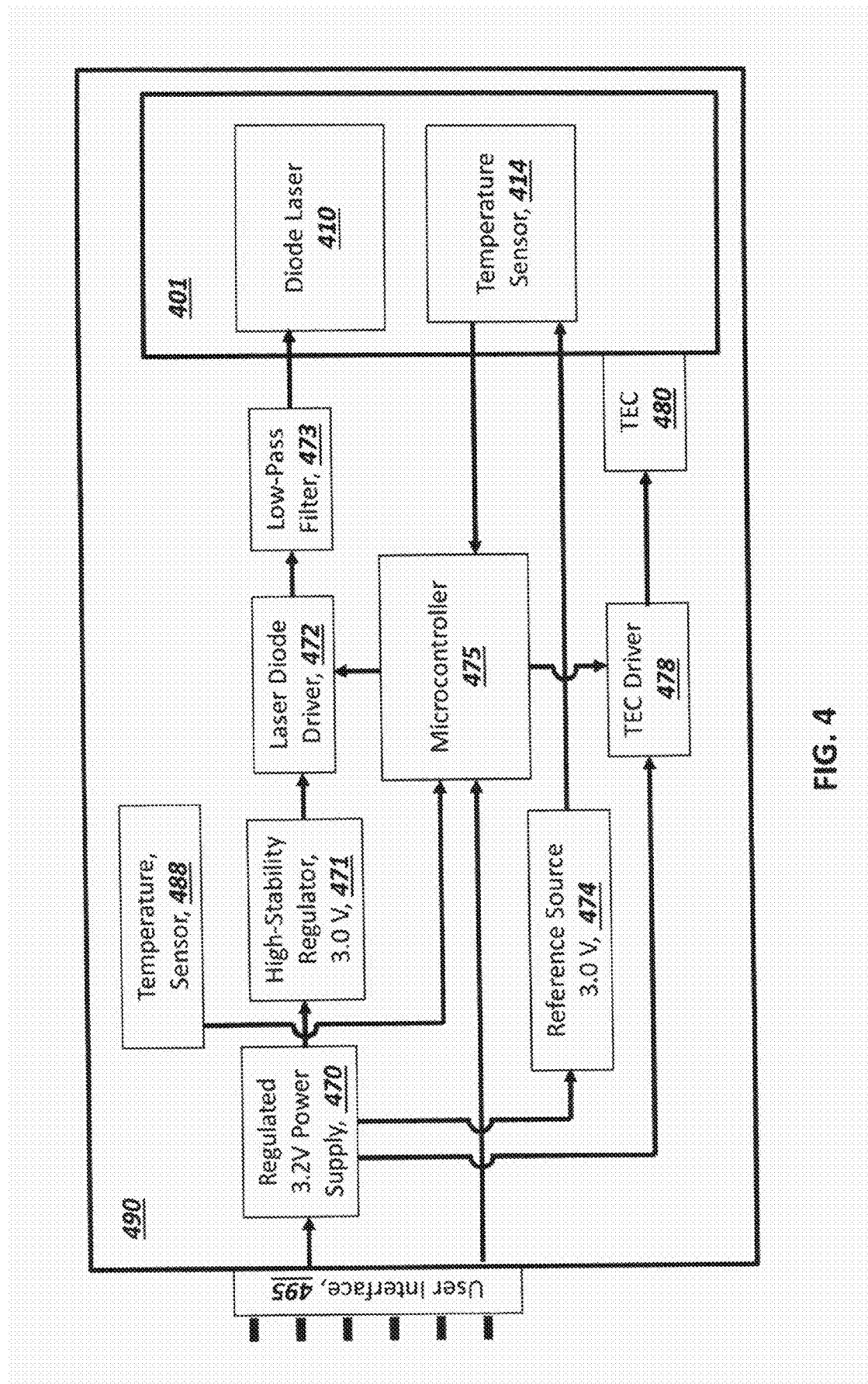
FIG. 4 is a block diagram of exemplary electronics of the compact, wavelength-stabilized laser, in accordance with the principles of the invention.

FIG. 4 is a block diagram of exemplary electronics to monitor the temperature of both the HECL near the diode laser chip using a first temperature sensor, 414, and the temperature inside the outer housing, 490, or within the body of the outer housing, 490, using a second temperature sensor, 488, and to drive the diode laser chip, 410, and thermoelectric cooler, 480. An external power supply (not shown) provides power, e.g., 5V DC, through a user interface, 495, to a regulated 3.2V power supply, 470. The regulated power supply, 470, provides power to a high-stability 3.0V regulator, 471, a reference source, 474, operating at 3.0V, and a microcontroller, 475, and the TEC driver, 478. The microcontroller, 475, may be any type of programmable computing device having at least one of processing capability and memory. For example, an ARM-based 32-bit microcontroller with 128 kB of flash memory, on board timers and a number of analog-to-digital as well as digital-to-analog converters. Another exemplary microcontroller component is the STM32F100RB from STMicroelectronics. The purpose of the microcontroller is to perform at least the following functions: (a) store user settings, including laser drive current and operating temperature, in its flash memory; and (b) enable sampled read-out of the output of the temperature sensors and determine a control output for the thermo-electric cooler, 480. In one aspect of the invention, the sampling rate may be selected based on a predetermined rate (e.g., 50 Hz). In another aspect of the invention, the sampling rate may be selected based on a measured temperature, wherein the sampling rate increases as the temperate increases and remains at a nominal, predetermined rate, as the temperate decreases. In other embodiments of the invention, the memory may be separate from the microcontroller or the microcontroller may be a general purpose processor (e.g., Intel Pentium series) that includes software, which when executed causes the general purpose processor to operate as a special purpose processor.

The high-stability regulator, 471, supplies power to the laser diode driver, 473, which provides a stable current to the diode laser chip, 410, through a low-pass filter, 473, in order to minimize current fluctuations that would lead to instabilities in the wavelength of the optical laser output. The reference source, 474, provides a reference voltage (e.g., 3.0 volts) to the temperature sensor, 414. Either or both temperature sensors, 414 and 488, may be thermistors or other types of temperature sensors. The microcontroller, 475, also provides a signal to a thermoelectric cooler driver, 478. As shown in FIG. 4, the laser diode, 410, and first temperature sensor 414, are housed within the inner enclosure, 401. An outer housing, 490, contains all the above referenced components including the inner enclosure, 401. The second temperature sensor, 488, may positioned as discussed with regard to FIG. 3, for example, or may be optionally be located outside of the outer housing, 490, itself. Usage of a second sensor allows monitoring of the case temperature of the laser module, 490, and thereby contributes to determining the laser operating parameters, including laser drive current and temperature of the inner enclosure, 401, for a wider range of environmental conditions.

In one embodiment of the invention, the current provided by the laser diode driver, 472, to the diode laser chip, 410, is set and maintained at a constant value. The microcontroller receives the measured temperatures of the inner housing, 401, and/or outer housing, 490, monitored by the first temperature sensor 414 and the second temperature sensor 488, respectively, and uses one or both measurements to determine a temperature correction factor (TCF), as described below and in FIGS. 5 and 6.

In another embodiment, the microcontroller receives the measured temperatures of the inner housing, 401, and outer housing, 490, monitored by the first temperature sensor, 414, and the second temperature sensor, 488, respectively, and controls the laser diode driver such that a laser diode drive current is adjusted in a range so as to maintain the emitted wavelength of the diode laser, 410, at a substantially same wavelength, independent of the diode laser temperature.

In another aspect of the invention, the microcontroller, 475, in receiving a measured temperature from at least one of the first temperature sensor, 414, and the second temperature sensor, 488, accesses a database or list of drive current values to determine a desired drive current value. The list of drive current values may be predetermined and stored in the memory to expedite the determination of the drive current value. A previously determined temperature compensation factor corresponding to each predetermined, stored, and retrieved current value may be stored and retrieved. Alternatively, the drive current may be determined dynamically from previously determined drive current values and previously determined temperature values. Thus, as an example, the laser module may be initialized as described below and in FIG. 5 for a set of predetermined laser drive current values, e.g., 100 mA, 200 mA, and 300 mA, etc.

In another aspect of the invention, the microcontroller, in receiving a measured temperature from at least one of the first temperature sensor, 414, and the second temperature sensor, 488, may access a database or list of temperature control values to provide appropriate control values for the TEC to maintain an appropriate cooling of housing, 401.

Figure 5:
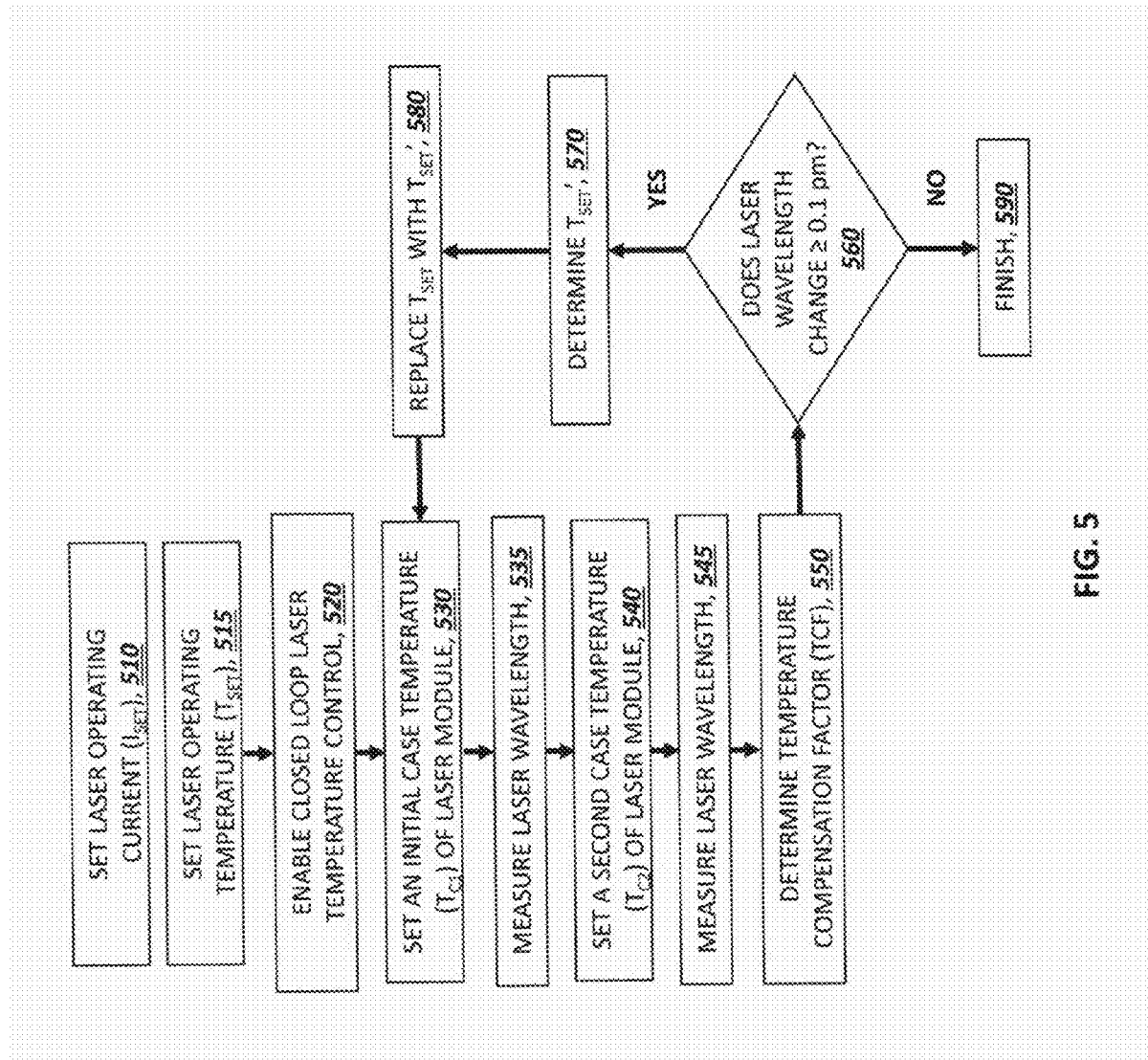
FIG. 5 is a flow chart describing an exemplary process for initializing the compact wavelength-stabilized laser source, in accordance with the principles of the invention.

FIG. 5 is a flow chart describing an exemplary process for initializing a compact, wavelength-stabilized laser source, in accordance with the principles of the invention, to obtain predetermined list of drive currents and temperature control values as a function of temperature.

Referring to FIG. 5, in step 510, a current, $I_{SET}$, is chosen at which the laser is operated. $I_{SET}$ is maintained at a constant value throughout the initialization process and subsequent operation. In step 515, a temperature at which the laser diode will operate is set, $T_{SET}$. $T_{SET}$ is typically selected between 10° C. and 40° C., depending on factors including at least the intended ambient operating range of the laser module, the temperature at which optimum laser stability is maintained, and the electrical power consumption of the laser module. After $T_{SET}$ is chosen, closed loop laser temperature control electronics are enabled in step 520. In one aspect of the invention, the software commands may be forwarded to the microcontroller 475, in FIG. 4 through the interface, 495. These software commands may represent, for example, an initialization command that causes the microcontroller to perform a predetermined sequence of initialization steps. In another aspect of the invention, the software commands may control each step of the sequence of initialization steps. In step 530, an initial case temperature, $T_{C1}$, is set based on a readout from the second temperature sensor, 488 (FIG. 4). The initial case temperature, $T_{C1}$, may be selected to be 25.00° C., for example. The laser wavelength is measured in step 535 using, for example, a wavelength meter capable of resolving 0.1 pm (picometer). For example, a Michelson interferometer with a path length of approximately 0.5 m is sufficient to measure a wavelength with the desired resolution. In step 540, the case temperature is set to a second value, $T_{C2}$. The second case temperature may be selected to proceed towards one of the extremes of an expected temperature range over which the laser module is expected to operate. This could be, for example, 40.00° C. (i.e., +/−15° C., from the initially selected temperature). The laser wavelength is then re-measured, in step 545. The laser wavelength measurements of steps 535 and 545 are then compared, in step 550, to that of the previous wavelength measurement in step 550 and if, in step 560, a difference of at least a known value or threshold value (e.g., 0.1 picometers) is determined, a temperature compensation factor is determined in step 570.

The laser wavelength measurement of step 535 may be performed by an external wavelength measuring apparatus, such as the cited Michelson interferometer having a path length of approximately 0.5 m, or a miniaturized wavelength measuring apparatus that is incorporated within the laser module, 300 (FIG. 3). Such a miniaturized wavelength measuring apparatus may, for example, comprise a gas cell, having a stable, narrow spectral absorption, or cinoruxe a fringe-counting apparatus, such as a miniaturized interferometer.

Figure 6:
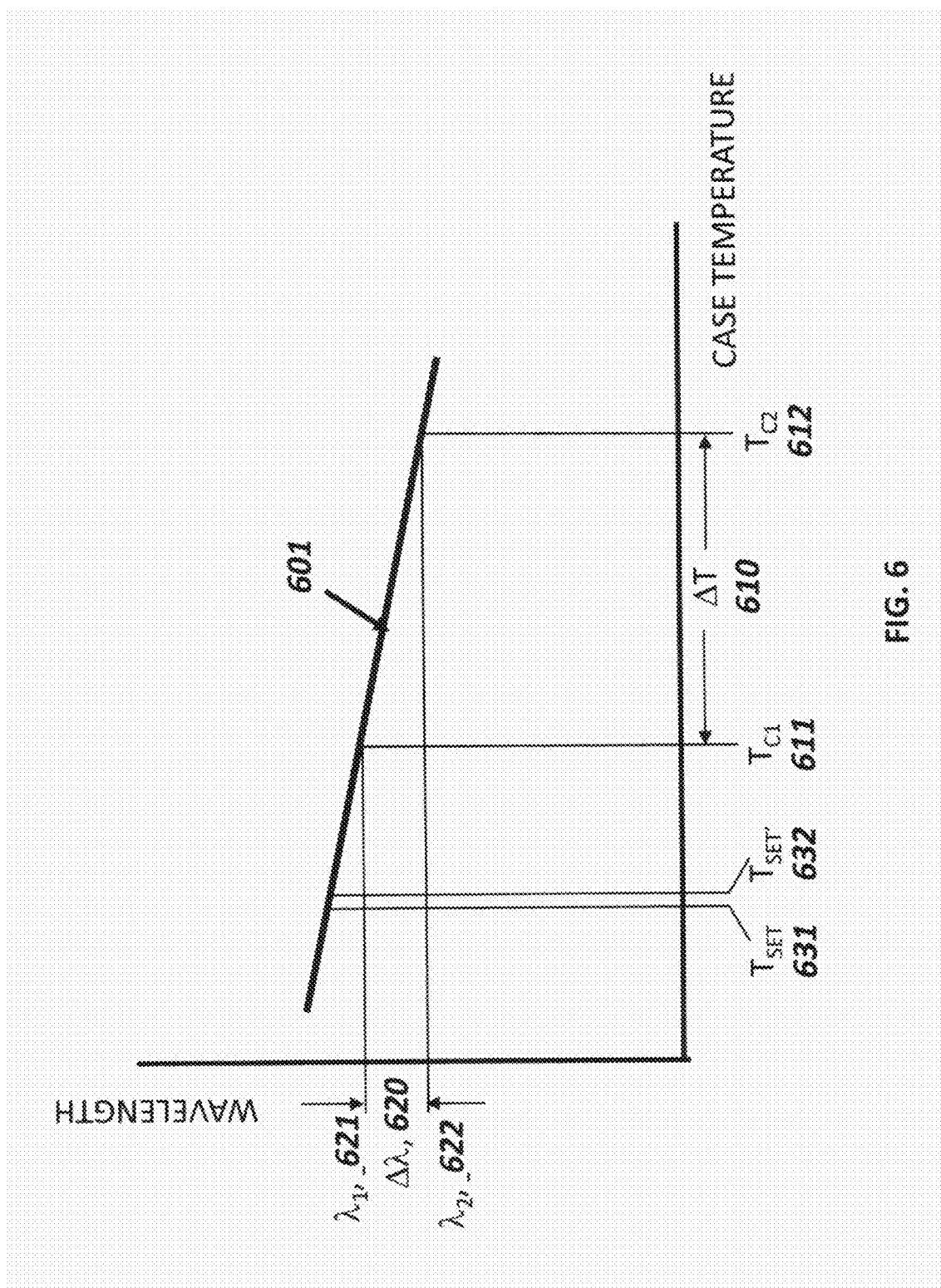
FIG. 6 illustrates an exemplary chart of changes in wavelength with respect to temperature.

The temperature compensation factor (TCF) is a parameter that is used to adjust the $T_{SET}$ slightly. The TCF for the laser module may be determined by the slope of the wavelength-vs.-temperature characteristic of the laser module, as illustrated in FIG. 6. In the exemplary case of FIG. 6, the wavelength-temperature characteristic, 601, is shown as a straight line of negative slope, which is representative of such characteristics for diode laser-based HECLs over the range of 10° C. and 40° C. The initial set temperature $T_{C1}$, 611, and the second set temperature $T_{C2}$, 612, are selected to be 25.00 and 40.00° C., respectively, with a temperature difference $\Delta T$, 610, equal to 15.00° in this exemplary case. The corresponding laser output wavelengths, $\lambda_1$, 621, and $\lambda_2$, 622, have a wavelength difference $\Delta \lambda$, 620. The TCF is the slope so determined as shown in Eq. 1:

$$TCF(1)=(\lambda_2-\lambda_1)/(T_{C2}-T_{C1})=\Delta\lambda/\Delta T \quad (1)$$

Typical TCF values are in the range of ±0.010.

Returning to FIG. 5, the temperature at which the laser module will be operated is corrected in step 570, as shown in Eq. 2:

$$T_{SET}'=T_{SET}(1+TCF)(T_{C2}-T_{C1}) \quad (2)$$

Although the laser characteristic shown in FIG. 6 is represented as a linear function, when the wavelength-temperature characteristic of FIG. 6 is not linear, $T_{SET}'$ can be defined and determined as a function of the case temperature, $T_C$, of which $T_{C1}$ and $T_{C2}$ are two exemplary values:

$$T_{SET}'=T_{SET}(1+f(T_C)) \quad (3)$$

Figure 7:
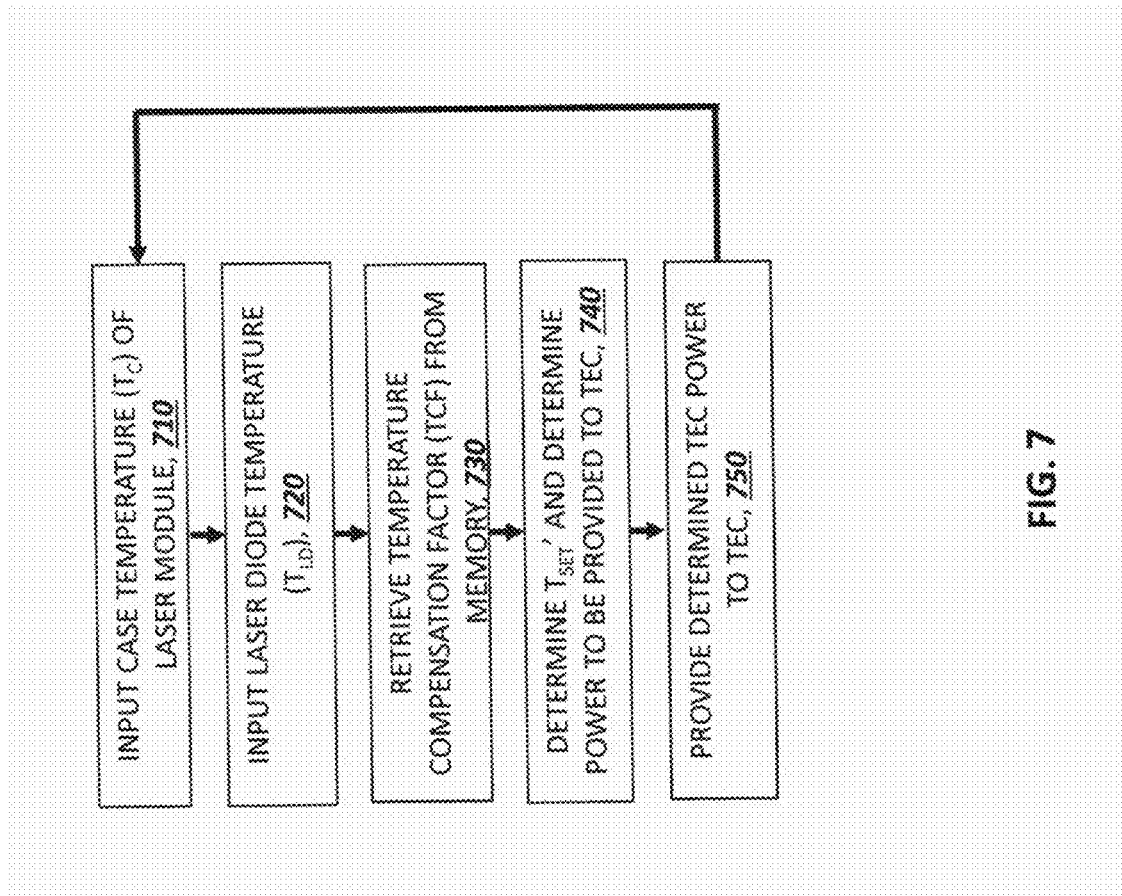
FIG. 7 is a flow chart describing an exemplary process for operating the compact, wavelength-stabilized laser source.

Subsequent to initialization as described above, the compact, wavelength-stabilized HECL may be operated as shown in the flow chart of FIG. 7. In step 710, the output of temperature sensor, 488 (FIG. 4), is continuously or periodically sampled to provide input data indicative of the case temperature, $T_C$, of the laser module. The output of temperature sensor, 414 (FIG. 4), is continuously or periodically sampled to provide input data indicative of the laser diode temperature, $T_{LD}$ in step 720. The temperature compensation factor (TCF), determined in step 550 (FIG. 5) and stored in a memory (e.g., in the microcontroller, 475 (FIG. 4)) is retrieved in step 730 and used to determine $T_{SET}'$ and the power to be provided to the TEC, 480 (FIG. 4) by the microcontroller, 475 (FIG. 4). The determined TEC power is provided as input to the TEC drive, 478, which provides a corresponding current to the TEC, 480.

Figure 8:
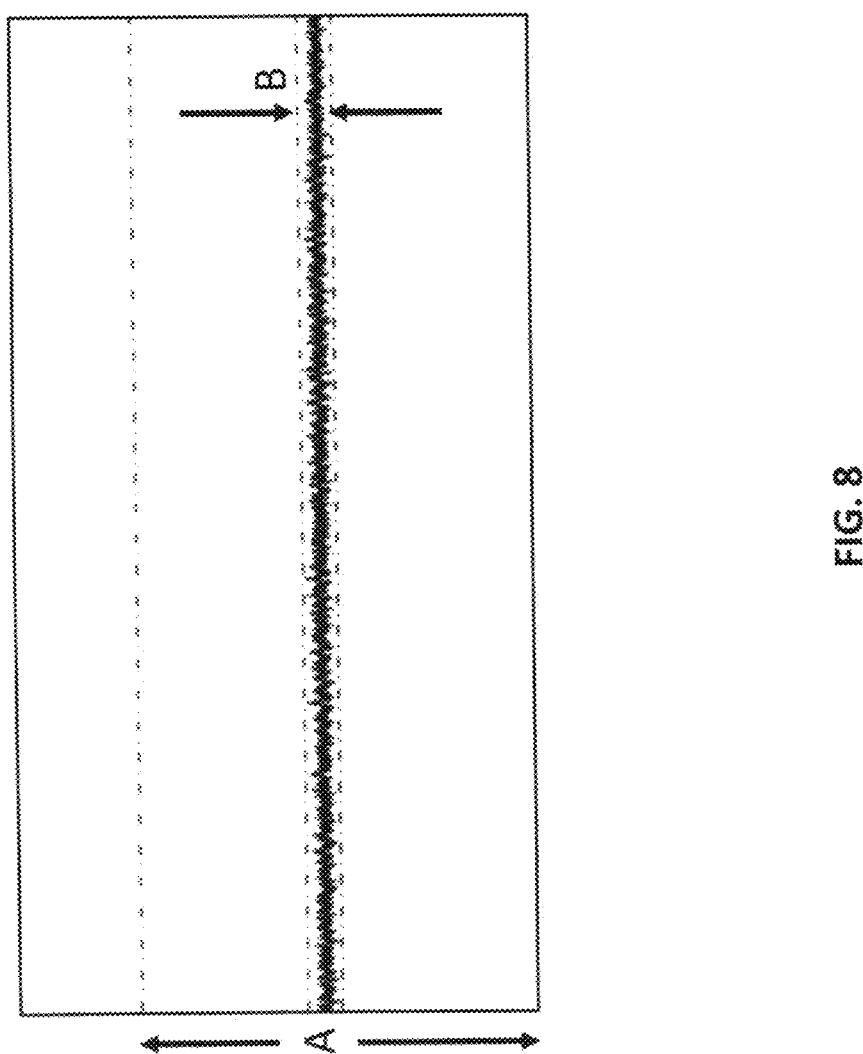
FIG. 8 illustrates data showing the short-term stability of a HECL operating at an output wavelength of 640 nm.

FIG. 8 is experimental data showing the short term stability of a compact diode laser-based HECL system in accordance with the principles of the invention. Data was obtained using a 1-meter Michelson interferometer and a high-speed photodiode. The signal amplitude marked A is the difference between the photodiode signal at constructive and destructive interference. The signal amplitude marked B shows the extent of the RMS noise, which varies over time scales of a millisecond or less. The typical RMS noise for a HECL system operating at 640 nm corresponds to 1/40 of an interference fringe, which is equivalent to approximately 1 part in $10^9$ wavelength stability.

Figure 9:
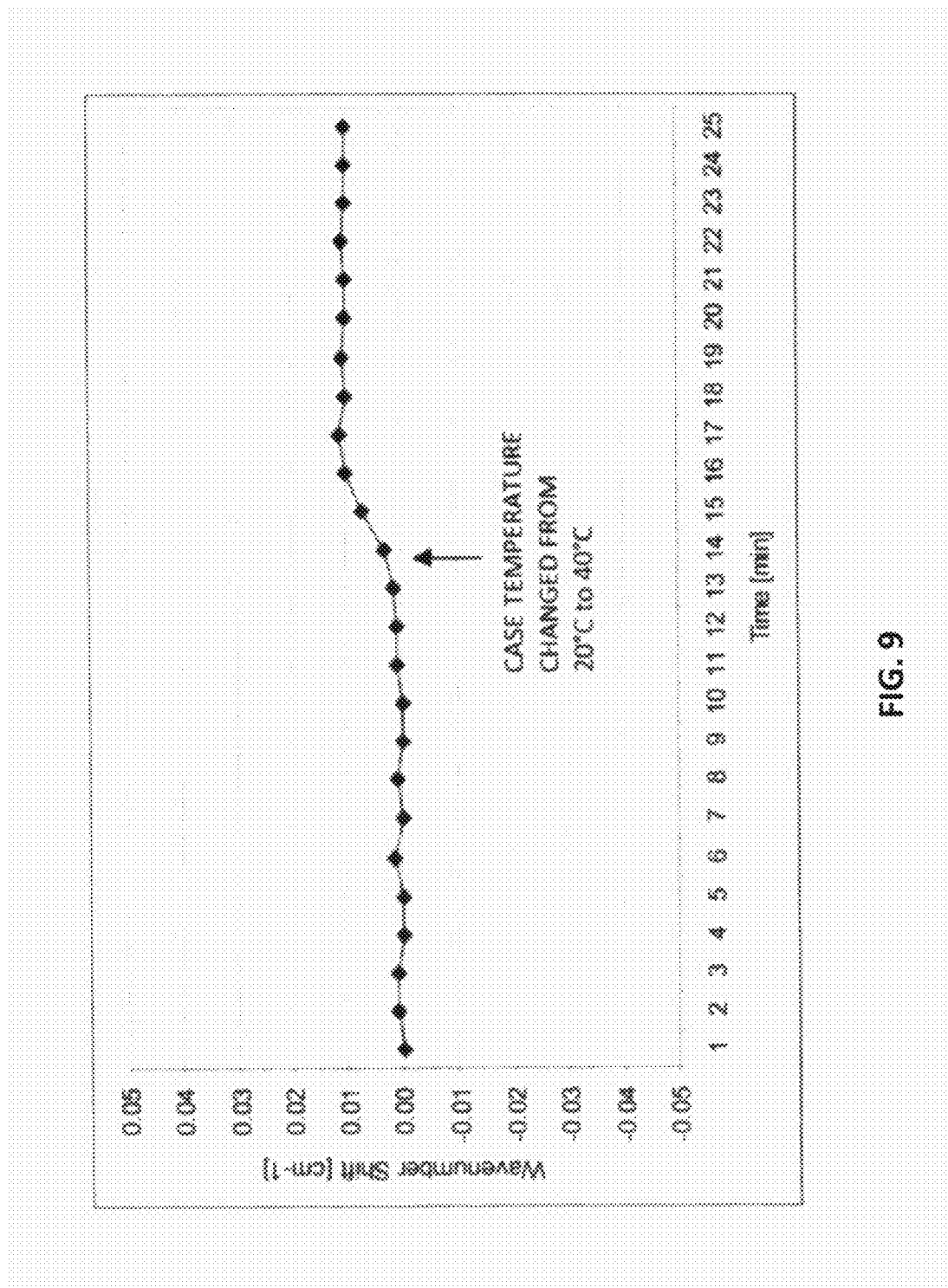
FIG. 9 illustrates data showing the long-term stability of a HECL laser operating at an output wavelength of 640 nm.

FIG. 9 is experimental data showing the change in frequency (wavenumber shift) of a 640 nm compact diode laser-based HECL system when the ambient temperature is changed significantly and abruptly, from 20° C. to 40° C. The wavenumber shift is less than 0.01 $cm^{-1}$, which corresponds to a wavelength shift of less than 0.001 nm or less than 1 part in $10^6$.

Figure 10:
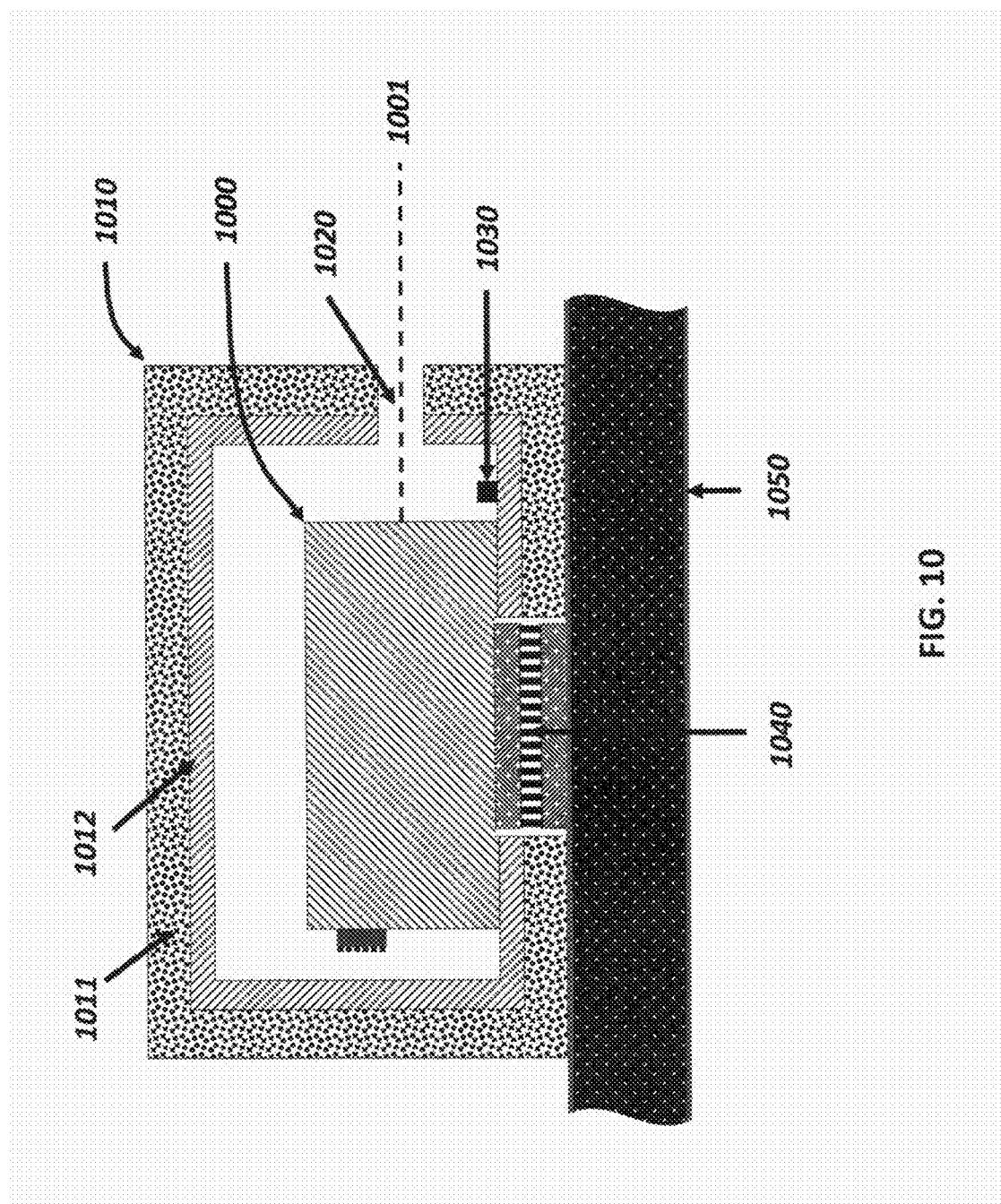
FIG. 10 is a schematic diagram of an exemplary compact, wavelength stabilized laser housed in a temperature-stabilized enclosure, in accordance with the principles of the invention.

FIG. 10 is a schematic diagram of another exemplary embodiment of the wavelength-stabilized laser in which the compact laser module, 1000 (shown, for example, as 300 in FIG. 3), is surrounded by another temperature-stabilized housing, 1010. This embodiment provides additional isolation of the laser module, 1000, from the ambient, so that environmental fluctuations may be suppressed further, enabling maintaining the case temperature, $T_C$, of the laser module within ±0.1° C., which enables stabilization of the output wavelength of the laser to one part in $10^{10}$ or better. The temperature-stabilized housing, 1010, may comprise a thermally conductive enclosure, 1012, insulated from ambient conditions by a thermal insulator, 1011. The enclosure, 1012, may be constructed of aluminum or any other thermally conductive material. The thermal insulator may be on the outside of the thermally conductive enclosure, 1011, as shown in the figure, or on the inside. A hole or window, 1020, in the temperature-stabilized housing, 1010, allows the output light beam, 1001, from the laser module, 1000, to exit the assembly. A thermal sensor, 1030, measures the temperature of the interior of the temperature-stabilized housing, 1010 and is used to control drive current to a TEC, 1040, in thermal communication with both the thermally conductive enclosure, 1011, and a heatsink, 1050. Electronics (not shown in FIG. 10) to determine the temperature sensed by the thermal sensor, 1030, and control the current provided to the TEC, 1040, may be located either external to the temperature-stabilized housing, 1010, or within it.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

Although, a computer, a processor and/or dedicated hardware/software are described herein as being capable of performing the processing described herein, it would be recognized that a computer, a processor and/or dedicated hardware/software are well-known elements in the art of signal processing and, thus, a detailed description of the elements of the processor need not provided in order for one skilled in the art to practice the invention described, herein. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The terms "a" or "an" as used herein are to describe elements and components of the invention. This is done merely for convenience and to give a general sense of the invention. The description herein should be read to include one or at least one and the singular also includes the plural unless indicated to the contrary.

The term "comprises", "comprising", "includes", "including", "as", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "or" refers to an inclusive "or" and not to an exclusive "or". For example, a condition A or B is satisfied by any one of the following: A is true (or present) and B is false (or not present); A is false (or not present) and B is true (or present); and both A and B are true (or present).

While there has been shown, described, and pointed out fundamental and novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention.

It is expressly intended that all combinations of those elements that perform substantially the same function in substantially the same way to achieve the same results are within the scope of the invention. Substitutions of elements from one described embodiment to another are also fully intended and contemplated.

Any reference signs in the claims should not be construed as limiting the scope of the claims or the invention described by the subject matter claimed.

What is claimed is:

1. A device for emitting laser radiation having a stable wavelength, the device comprising:
   a thermally conductive first housing containing:
      a hybrid external cavity laser comprising:
         a diode laser having a known emission wavelength;
         optics collecting and collimating the known emission wavelength; and
         a volume Bragg grating optical component partially reflecting the collected and collimated known wavelength;
      a first temperature sensor proximate the diode laser;
      a thermally conductive member in thermal contact with the hybrid external cavity laser and the first temperature sensor at a first surface and in thermal contact with the first housing at a second surface;
   a thermally conductive second housing enclosing the first housing, the second housing comprising:
      a thermoelectric cooler in thermal contact with said first housing and the second housing; and
      an opening, optically aligned to an opening in said first housing, allowing said known emission wavelength to exit said second housing;
      a second temperature sensor and an electronic circuitry mounted on a circuit board in thermal contact with said second housing, said electronic circuitry:
         receiving a temperature measured by at least one of the first temperature sensor and the second temperature sensor, said temperature being associated with a temperature of said diode laser and said electronic circuity, respectively, and
         controlling operation of the diode laser and the thermoelectric cooler, wherein the electronic circuitry controls:
            a laser drive current provided to said diode laser to cause said diode laser to emit said known wavelength; and
            a temperature control voltage applied to said thermoelectric cooler to maintain said diode laser at said known emission wavelength.

2. The device of claim 1, wherein the emission wavelength is between about 375 nm and about 3 μm.

3. The device of claim 1, wherein the emission wavelength is between about 630 nm and about 650 nm.

4. The device of claim 1, wherein the first housing is a TO package.

5. The device of claim 1, wherein the first housing is a butterfly package.

6. The system of claim 1, wherein the thermoelectric cooler is contained within the first housing.

7. The device of claim 1, further comprising:
   a memory storing a laser drive current for each of a plurality of measured temperature values.

8. The device of claim 7, wherein said measured temperature values are temperature values associated with at least one of said first temperature sensor and said second temperature sensor.

9. The device of claim 1, wherein the first housing is at least in part thermally insulated from the second housing.

10. The device of claim 1, wherein the electronic circuitry includes a microcontroller.

11. The device of claim 1, wherein the electronic circuitry includes a voltage reference source.

12. The device of claim 1, further comprising:
a third housing enclosing said second housing; said third housing comprising:
an opening, optically aligned to said opening is said second housing; and
a third temperature sensor in contact with said third housing; and
electronic circuitry:
receiving a temperature measured by said third temperature sensor.

13. The device of claim 1, wherein said temperature control voltage applied to said thermoelectric cooler is based on said monitored temperatures of at least one of said first temperature sensor and said second temperature.

14. The device of claim 1, wherein said diode laser drive current is predetermined.

15. The device of claim 1, further comprising:
input means for inputting initial operating conditions for said laser diode.

16. A method, operable in a processor, for determining a temperature setting of a laser diode, the method causing the processor to execute the steps comprising:

setting an operating temperature of said laser diode;
varying a temperature surrounding said laser diode in a series of known step sizes;
measuring a wavelength of said laser diode for each of said known step sizes;
determining a temperature compensation factor at each of said known step size;
determining a difference in wavelengths between a current step taken at a current temperature and a previous step taken at a previous temperature; and
setting a new operating temperature based on said determined temperature compensation factor when said difference is greater than a known threshold; and
retaining the operating temperature when said difference is less than said known threshold,
by determining a power to maintain said set operating temperature; and
applying said determined power to a cooler.

17. The method of claim 16, further comprising:
storing said determined temperature compensation factor at each of said known step sizes.

\* \* \* \* \*